United States Patent
Akiyama et al.

(10) Patent No.: US 9,246,461 B2
(45) Date of Patent: Jan. 26, 2016

(54) MANUFACTURING METHOD OF PIEZOELECTRIC-BODY FILM, AND PIEZOELECTRIC-BODY FILM MANUFACTURED BY THE MANUFACTURING METHOD

(75) Inventors: Morito Akiyama, Saga (JP); Kazuhiko Kano, Aichi-ken (JP); Akihiko Teshigahara, Aichi-ken (JP)

(73) Assignees: DENSO CORPORATION, Aichi (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 654 days.

(21) Appl. No.: 13/380,995

(22) PCT Filed: Jun. 30, 2010

(86) PCT No.: PCT/JP2010/061162
§ 371 (c)(1),
(2), (4) Date: Dec. 27, 2011

(87) PCT Pub. No.: WO2011/002028
PCT Pub. Date: Jan. 6, 2011

(65) Prior Publication Data
US 2012/0107557 A1    May 3, 2012

(30) Foreign Application Priority Data

Jul. 1, 2009 (JP) ................. 2009-157031

(51) Int. Cl.
C23C 14/00 (2006.01)
H03H 3/02 (2006.01)
C23C 14/06 (2006.01)

(52) U.S. Cl.
CPC .............. *H03H 3/02* (2013.01); *C23C 14/0036* (2013.01); *C23C 14/0617* (2013.01); *C23C 14/0641* (2013.01); *Y10T 428/24355* (2015.01)

(58) Field of Classification Search
CPC ..................... C23C 14/0036; C23C 14/0641
See application file for complete search history.

(56) References Cited

U.S. PATENT DOCUMENTS

| | | | |
|---|---|---|---|
| 2002/0190814 A1 | 12/2002 | Yamada et al. | |
| 2004/0135144 A1 | 7/2004 | Yamada et al. | |
| 2005/0093397 A1 | 5/2005 | Yamada et al. | |
| 2008/0296529 A1* | 12/2008 | Akiyama et al. | ....... 252/62.9 PZ |

FOREIGN PATENT DOCUMENTS

| | | |
|---|---|---|
| JP | 2002-344279 | 11/2002 |
| JP | 2002-372974 | 12/2002 |
| JP | 2004-312611 | 11/2004 |
| JP | 2005-236337 | 9/2005 |
| JP | 2006-050021 | 2/2006 |
| JP | 2009-010926 | 1/2009 |

OTHER PUBLICATIONS

Morito Akiyama et al., Influence of growth temperature and scandium concentration on piezoelectric response of scandium aluminum nitride alloy thin films, Applied Physics Letters, 95, 162107 (2009).
International Search Report for PCT/JP2010/061162 dated Oct. 5, 2010.

* cited by examiner

*Primary Examiner* — Keith Hendricks
*Assistant Examiner* — Timon Wanga

(57) ABSTRACT

A method for manufacturing a piezoelectric thin film including an aluminum nitride thin film containing scandium on a substrate, the method includes: sputtering step for sputtering aluminum and scandium under an atmosphere containing at least a nitrogen gas. In the sputtering step in the method according to the present invention, a scandium content rate falls within the range from 0.5% by atom to 50% by atom when a temperature of the substrate falls within the range from 5° C. to 450° C. during the sputtering step.

3 Claims, 4 Drawing Sheets

F I G. 3
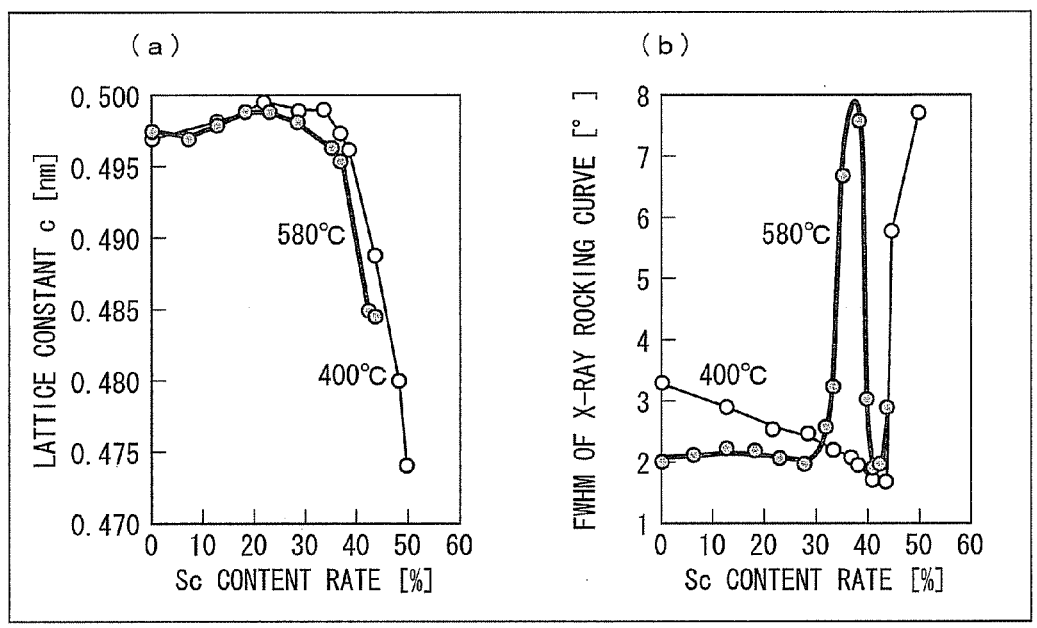

F I G. 5
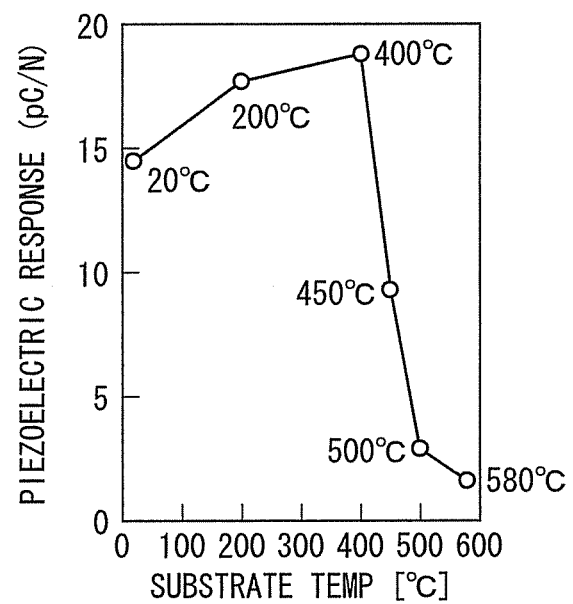

MANUFACTURING METHOD OF PIEZOELECTRIC-BODY FILM, AND PIEZOELECTRIC-BODY FILM MANUFACTURED BY THE MANUFACTURING METHOD

CROSS-REFERENCE TO RELATED APPLICATIONS

This application is a National Phase entry of International Application No. PCT/JP2010/061162 filed on 30 Jun. 2010, which claims priority under 35 U.S.C. §§119(a) and 365(b) to JP Application No. 2009-157031 filed on 1 Jul. 2009. The above recited patent applications are incorporated herein by reference in their entirety.

TECHNICAL FIELD

The present invention relates to a method for manufacturing a piezoelectric thin film, and particularly relates to a method for manufacturing a piezoelectric thin film including a substrate on which an aluminum nitride thin film added with scandium is provided.

BACKGROUND ART

Devices in which a piezoelectric phenomenon is utilized are used in various fields. The devices have been increasingly used in portable devices (e.g. a cellular phone) which have been strongly required to be further miniaturized and smaller in power consumption. As examples of the devices, an IF (intermediate frequency) filter, an RF (radio frequency) filter, and the like are given. Specific examples of the IF filter and the RF filter encompass a SAW filter which is a filter including a surface acoustic wave resonator (SAWR), and the like.

The SAW filter is a filter including a resonator in which an acoustic wave transmitted on a solid surface is utilized. Design and a manufacturing technique of the SAW film have been improved to thereby meet severe demands of users. However, the improvement of the SAW filter is approaching to its limit, along with an increase in frequency to use.

In view of the circumstances, an FBAR filter including a film bulk acoustic resonator (FBAR) has been developed as a new filter in place of the SAW filter. The FBAR filter is one of RF-MEMS (radio frequency-micro electro mechanical system) devices.

The RF-MEMS is a technique which has been drawn the attention in recent years. The RF-MEMS is formed by applying an MEMS to an RF front end. The MEMS is a technique for forming a device (e.g., a very small actuator, sensor, resonator, etc.) by forming a mechanical microstructure mainly on a semiconductor substrate.

The FBAR filter, which is one of the RF-MEMS devices, is a filter including the resonator in which a thickness longitudinal vibration mode of a thin-film for indicating piezoelectric response is utilized. Specifically, the FBAR filter includes the resonator in which the following phenomenon is utilized: a piezoelectric thin film receives a high-frequency electric signal to thereby generate thickness longitudinal vibration and then the vibration generates resonance in a thickness direction of the thin film. Such FBAR filter can resonate in a gigahertz band. The FBAR filter having such property has low loss and can be operated in a wide band, and in addition, makes it possible to attain further miniaturization and electric power saving of portable devices.

Further, the RF-MEMS devices (in addition to the FBAR filter, e.g., an RF-MEMS capacitor and an RF-MEMS switch) in which the piezoelectric phenomenon is utilized attain low loss, high isolation, and low strain in a high-frequency band.

Patent Literature 1 discloses that a piezoelectric thin film including an aluminum nitride thin film which is added with scandium as a third component has satisfactory piezoelectric response.

CITATION LIST

Patent Literature

Patent Literature 1
Japanese Patent Application Publication Tokukai No. 2009-010926 A (Publication Date: Jan. 15, 2009)

SUMMARY OF INVENTION

Technical Problem

However, when the number of atoms of scandium and the number of atoms of aluminum of an aluminum nitride thin film are 100% by atom in total according to the piezoelectric thin film described in Patent Literature 1, the piezoelectric response is reduced in a case where the number of atoms of the scandium falls within the range from 35% by atom to 40% by atom in comparison with a case where scandium is not contained (See FIG. 1(b)). That is, the piezoelectric thin film described in Patent Literature 1 can be still improved upon.

The present invention has been made in view of the aforementioned problem, and a main object of the present invention is to provide a method for manufacturing a piezoelectric thin film (i) whose piezoelectric response is not reduced in comparison with that of a piezoelectric film which does not contain scandium even when the number of atoms of scandium falls within the range from 35% by atom to 40% by atom and (ii) which includes an aluminum nitride thin film added with scandium.

Solution to Problem

The inventors of the present invention have been diligently examined a method for manufacturing a piezoelectric thin film, in which method piezoelectric response is not reduced even when the number of atoms of scandium falls within the range from 35% by atom to 40% by atom. As a result, the inventors found that the piezoelectric response of the piezoelectric thin film is not reduced by setting a substrate temperature within a predetermined temperature range when scandium and aluminum are sputtered. Accordingly, the inventors achieved the present invention. The present invention was achieved on the basis of such new knowledge, and includes the following inventions.

In order to attain the aforementioned object, a method for manufacturing a piezoelectric thin film including a substrate on which an aluminum nitride thin film containing scandium is provided, the method according to the present invention includes: a sputtering step for sputtering aluminum and scandium so that, under an atmosphere containing at least a nitrogen gas, a scandium content rate falls within the range from 0.5% by atom to 50% by atom when the number of atoms of scandium and the number of atoms of aluminum of an aluminum nitride thin film are 100% by atom in total, the substrate having a temperature within the range from 5° C. to 450° C. during the sputtering step.

Even when the scandium content rate falls within the range from 35% by atom to 40% by atom where the number of atoms of scandium and the number of atoms of aluminum of an aluminum nitride thin film are 100% by atom in total, the aforementioned arrangement can prevent reduction in piezoelectric response of the piezoelectric thin film. Further, even in a case where the scandium content rate is 35% by atom to 40% by atom, the piezoelectric response of the piezoelectric thin film can be improved in comparison with that of an aluminum nitride thin film which does not contain scandium.

With this, it is unnecessary to set the scandium content rate minutely when the piezoelectric thin film is manufactured. This makes it possible to manufacture easily the piezoelectric thin film including the aluminum nitride thin film containing scandium. Therefore, a defective rate of the piezoelectric thin film to be manufactured can be reduced.

Advantageous Effects of Invention

As described above, in a method for manufacturing a piezoelectric thin film according to the present invention, aluminum and scandium are sputtered so that, under an atmosphere containing at least a nitrogen gas, a scandium content rate falls within the range from 0.5% by atom to 50% by atom when the number of atoms of scandium and the number of atoms of aluminum of an aluminum nitride thin film are 100% by atom in total. Further, a temperature of the substrate falls within the range from 5° C. to 450° C. during the sputtering.

This can prevent reduction in piezoelectric response of the piezoelectric thin film in comparison with a piezoelectric thin film including an aluminum nitride thin film which does not contain scandium, even when the scandium content rate falls within the range from 35% by atom to 40% by atom.

For a fuller understanding of the nature and advantages of the invention, reference should be made to the ensuing detailed description taken in conjunction with the accompanying drawings.

BRIEF DESCRIPTION OF DRAWINGS

FIG. 1(a) shows a case where a substrate temperature is 400° C. during a sputtering step; and FIG. 1(b) shows a substrate temperature is 580° C. during a sputtering step.

FIG. 2(a) shows a case where a substrate temperature in a sputtering step is changed; and FIG. 2 (b) shows a case where a scandium content rate is changed.

FIG. 3 shows a parameter which is calculated on the basis of an X-ray diffraction pattern of a piezoelectric thin film made in Example 1 and an X-ray diffraction pattern of a piezoelectric thin film made in Comparative Example 1: FIG. 3(a) shows a length of a crystal lattice of Sc-containing aluminum nitride along a c-axis; and FIG. 3(b) shows an FWHM of an X-ray rocking curve of Sc-containing aluminum nitride.

FIG. 4(a) shows a case where a substrate temperature is 580° C. and an Sc content rate is 0% by atom; FIG. 4(b) shows a case where a substrate temperature is 580° C. and an Sc content rate is 36% by atom; FIG. 4(c) shows a case where a substrate temperature is 580° C. and an Sc content rate is 43% by atom; FIG. 4(d) shows a case where a substrate temperature is 400° C. and an Sc content rate is 0% by atom; FIG. 4(e) shows a case where a substrate temperature is 400° C. and an Sc content rate is 36% by atom; FIG. 4(f) shows a case where a substrate temperature is 400° C. and an Sc content rate is 43% by atom; and FIG. 4(g) shows a relationship between an Sc content rate and a particle size of Sc-containing aluminum nitride in a case where a substrate temperature is 400° C. or 580° C. during a sputtering step.

FIG. 5 shows piezoelectric response of a scandium-containing aluminum nitride thin film having a scandium content of 42% in a case where a substrate temperature is a temperature of a room temperature (20° C.), 200° C., 400° C., 450° C., 500° C., and 580° C.

DESCRIPTION OF EMBODIMENTS

Figure 1:
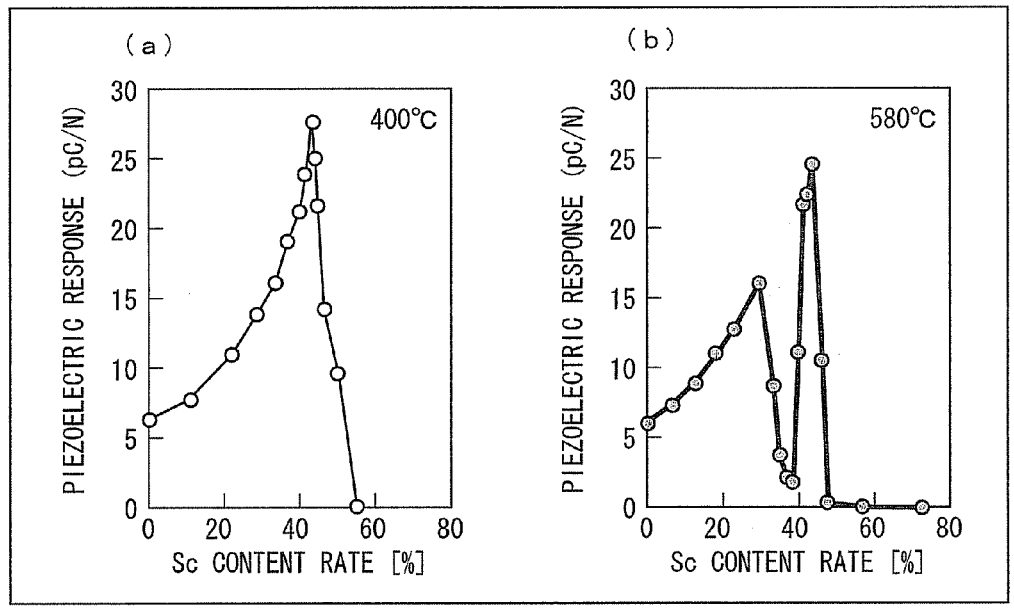
FIG. 1 shows a relationship between a scandium content rate and piezoelectric response of a piezoelectric thin film according to the present invention.

A piezoelectric thin film according to the present invention will be described below with reference to FIGS. 1(a) and 1(b) and FIGS. 2(a) and 2(b). Prior to description of the piezoelectric thin film according to the present invention, terms etc. used in the present specification etc. will be described below.

In a case where the piezoelectric thin film according to the present invention is used in a piezoelectric element in which a piezoelectric phenomenon is utilized, specific usage of the piezoelectric thin film is not particularly limited. For example, the piezoelectric thin film can be used in a SAW device or an RF-MEMS device. Further, "piezoelectric material" in the present specification etc. means a substance having a property which causes a potential difference when a mechanical energy is applied to the substance, i.e., piezoelectricity (hereinafter, also referred to as piezoelectric response). Further, "piezoelectric thin film" means a thin film having the aforementioned property.

Further, "% by atom" in the present specification etc. indicates atomic percentage. In the present specification etc., "% by atom" is used for indicating the number of atoms of scandium or the number of atoms of aluminum when the number of atoms of scandium and the number of atoms of aluminum are 100% by atom in total, unless otherwise noted. In other words, "% by atom" is a concentration of scandium atom or aluminum atom in scandium-containing aluminum nitride. Further, in the present specification, "% by atom" of scandium will be described below as a scandium content rate with respect to aluminum nitride.

A scandium-containing aluminum nitride thin film (hereinafter, referred to also as an Sc-containing aluminum nitride thin film) is expressed by the following general formula: $Sc_xAl_{1-x}N$ (where x represents the scandium content rate and the scandium content rate falls within the range from 0.005 to 0.5). For example, an aluminum nitride thin film having a scandium content of 10% by atom is expressed by "$Sc_{0.10}Al_{0.90}N$".

(Arrangement of Piezoelectric Thin Film)

An arrangement of the piezoelectric thin film according to the present invention will be described below. The piezoelectric thin film according to the present invention has a substrate on which the Sc-containing aluminum nitride thin film is formed. The Sc-containing aluminum nitride thin film contains scandium atoms within the range from 0.5% by atom to 50% by atom when the number of atoms of scandium and the number of atoms of aluminum are 100% by atom in total.

The substrate is not particularly limited as long as the substrate can support the Sc-containing aluminum nitride thin film without causing deformation of the Sc-containing aluminum nitride thin film. Examples of a material of the substrate encompass silicon (Si) monocrystal and a base (e.g., Si monocrystal) having a surface on which silicon, diamond, or another polycrystalline film is formed.

Further, it is preferable that an X-ray rocking curve of the piezoelectric thin film according to the present invention has an FWHM of 3.2 degree or less. When the X-ray rocking curve has the FWHM of 3.2 degree or less, the scandium content rate falls within the range from 0.5% by atom to 45% by atom. In other words, it is preferable that the scandium content rate of the piezoelectric thin film according to the present invention falls within the range from 0.5% by atom to 45% by atom. Note that details (e.g., a measurement condition of the X-ray rocking curve of the piezoelectric thin film) will be described below, and description thereof is herein omitted.

Furthermore, it is preferable that surface roughness Ra of the piezoelectric thin film according to the present invention is less than 1.2 nm.

The X-ray rocking curve having the FWHM of 3.2 degree or less and the piezoelectric thin film having the surface roughness Ra of less than 1.2 nm mean high crystal orientation. In other words, when the FWHM of the X-ray rocking curve and the surface roughness of the piezoelectric thin film fall within the aforementioned ranges, crystals are more oriented in one direction. Accordingly, piezoelectricity of the piezoelectric thin film can be increased.

(Method for Manufacturing Piezoelectric Thin Film)

Next, a method for manufacturing a piezoelectric thin film according to the present invention will be described below. The method for manufacturing a piezoelectric thin film according to the present invention includes a sputtering step in which, under an atmosphere containing a nitrogen gas ($N_2$) (e.g., under an atmosphere of a nitrogen gas ($N_2$) or under a mixed atmosphere of a nitrogen gas ($N_2$) and an argon gas (Ar)), a substrate (e.g., silicon (Si) substrate) is subjected to sputtering with use of aluminum and scandium so that the scandium content rate falls within the range from 0.5% by atom to 50% by atom when the number of atoms of scandium and the number of atoms of aluminum of the aluminum nitride thin film are 100% by atom in total. Further, the substrate temperature during the sputtering step falls within the range from 5° C. to 450° C. in the method for manufacturing a piezoelectric thin film according to the present invention. Among this range of the substrate temperature, the substrate temperature during the sputtering step preferably falls within the range from 200° C. to 400° C., and most preferably 400° C.

When a thin film is formed by sputtering in a state of the substrate temperature in a range of 5° C. to 450° C. during the sputtering step, an Sc-containing aluminum nitride thin film which is tightly attached to the substrate and has high purity can be formed. Further, the substrate temperature during the sputtering step falls within the range from 5° C. to 450° C., and therefore the piezoelectric response when the scandium content rate falls within the range from 35% by atom to 40% by atom can be improved in comparison with the piezoelectric response when a scandium content of an aluminum nitride thin film is 0% by atom.

Further, when the substrate temperature during the sputtering step has been in a range of 200° C. to 400° C., the piezoelectric response has been conventionally reduced in the range from scandium content of 35% by atom to 40% by atom. However, the present invention can prevent such reduction in piezoelectric response in the aforementioned range. This makes it possible to further reduce defective rate of the piezoelectric thin films to be manufactured, and therefore manufacturing quality of the piezoelectric thin films can be improved.

Note that scandium and aluminum may be used in the sputtering step, and scandium and aluminum are preferably sputtered at the same time. By sputtering scandium and aluminum at the same time, the Sc-containing aluminum nitride thin film in which scandium and aluminum are not distributed partially (i.e., are distributed evenly) can be formed.

(Details of Sputtering Step: Substrate Temperature)

Next, the range of the substrate temperature in the sputtering step will be described below. In a case where the piezoelectric thin film according to the present invention is manufactured, the substrate temperature is in a range of a room temperature to 450° C. during the sputtering step. As described above, it is most preferable that, among this range of the substrate temperature, the substrate temperature during the sputtering step is 400° C.

Figure 2:
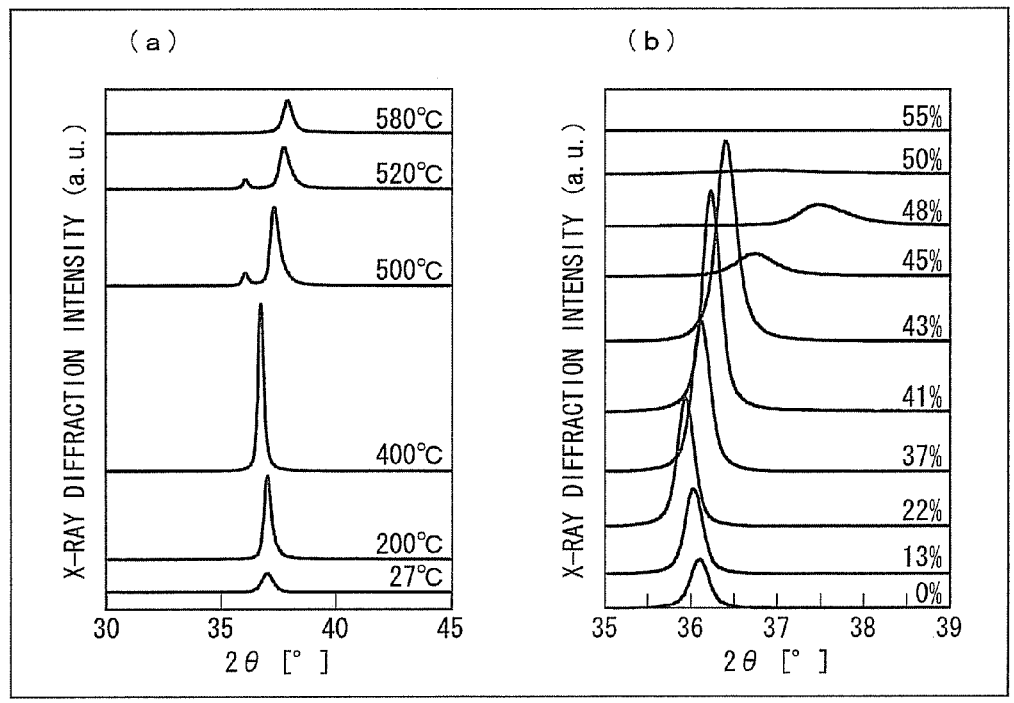
FIG. 2 shows an X-ray diffraction intensity of a piezoelectric thin film according to the present invention.

The reason why the most preferable substrate temperature is 400° C. will be described below briefly. FIG. 2($a$) shows an X-ray diffraction intensity when the substrate temperature is changed from 27° C. to 580° C. in a case where an $Sc_{0.43}Al_{0.57}N$ thin film is formed on a silicon substrate. Note that the X-ray diffraction intensity is measured with use of M03X-HF produced by MAC Science Co. Ltd.

As shown in FIG. 2($a$), a single peak is generated at an angle of 37.00° when the substrate temperature is in the range from 27° C. to 400° C., and a magnitude of the single peak becomes maximum when the substrate temperature is 400° C. Further, when the substrate temperature exceeds 500° C., two peaks are generated at angles of 36.06° and 37.30°, and a magnitude of each peak is reduced. Moreover, when the substrate temperature is 580° C., a single peak is generated again at an angle of 37.30°. However, the magnitude of the peak is further reduced.

As described above, FIG. 2($a$) shows that magnitude of the single peak becomes maximum when the substrate temperature is 400° C., and, when the substrate temperature exceeds 500° C., a position of the peak is shifted to a higher angle and the magnitude of the peak is reduced. In other words, crystalline of the Sc-containing aluminum nitride becomes maximum when the substrate temperature is 400° C., and a lattice constant c of a crystal becomes short when the substrate temperature exceeds 500° C.

Note that "room temperature" in the present specification etc. is a temperature defined by Japanese Industrial Standard (JIS Z 8703), and means a temperature within the range of 20° C.±15° C. (i.e., 5° C. to 35° C.).

(Details of Sputtering Step: Scandium Content Rate)

Next, the rate of scandium contained in the Sc-containing aluminum nitride thin film will be described below.

The rate of scandium contained in the Sc-containing aluminum nitride thin film may fall within the range from 0.5% by atom to 50% by atom, more preferably from 35% by atom to 43% by atom, and most preferably 43% by atom.

Herein, aluminum nitride which does not contain scandium (i.e., Sc content of 0% by atom) has piezoelectric response to some extent (FIG. 1($a$)). Accordingly, the Sc-containing aluminum nitride thin film in the piezoelectric thin film according to the present invention has the scandium content rate within the range from 0.5% by atom to 50% by atom in order to obtain higher piezoelectric response than that obtained when the scandium content is 0% by atom.

Hereinafter, the reason why the scandium content of 43% by atom is preferable will be described briefly. FIG. 2($b$) shows a change in X-ray diffraction intensity in a case where the scandium content rate is changed from 0% by atom to 55% by atom. Note that the X-ray diffraction intensity is measured with use of M03X-HF produced by MAC Science Co. Ltd as well as the aforementioned example.

As shown in FIG. 2($b$), the X-ray diffraction intensity is increased as the scandium content rate is increased until the scandium content rate reaches 41% by atom. However, when the scandium content rate reaches 45% by atom or more, the X-ray diffraction intensity is rapidly reduced. As described above, FIG. 2(b) shows that the magnitude of the single peak becomes maximum when the scandium content rate is 43% by atom.

Note that the position of the peak is shifted to reduce an angle 2θ as the scandium content rate is increased, and then is shifted to increase the angle 2θ when the scandium content rate reaches 37% or more. These things show that the Sc-containing aluminum nitride thin film has a crystal which has a wurtzite structure and c-axis orientation.

Next, the piezoelectric response obtained in a case where (i) the substrate temperature is 400° C. during the sputtering step and (ii) the scandium content rate is changed from 0% by atom to 55% by atom will be described below with reference to FIG. 1(a). Note that how to measure data shown in FIG. 1(a) will be described below in Example 1 in detail, so that detailed description thereof is herein omitted.

FIG. 1(a) shows that the piezoelectric response is increased as the scandium content rate is increased from 0% by atom to 43% by atom. Further, when the scandium content rate is 43% by atom, the piezoelectric response of the piezoelectric thin film obtains a maximum value (about 28 pC/N). This maximum value is larger than the piezoelectric response (about 25 μC/N) obtained when a substrate temperature is 580° C. as is conventionally performed.

Unlike a conventional piezoelectric thin film including an Sc-containing aluminum nitride thin film, the piezoelectric response of the piezoelectric thin film according to the present invention is not reduced when the scandium content rate is in the range from 35% by atom to 40% by atom as shown in FIG. 1(a).

Next, how to set the scandium content rate within the range from 0.5% by atom to 50% by atom will be described below. In order to set the scandium content rate within the range from 0.5% by atom to 50% by atom, a target power density of the scandium may be set within the range from 0.05 W/cm$^2$ to 10 W/cm$^2$ during the sputtering step in a case where a target power density of aluminum is fixed within the range of 7.9 W/cm$^2$.

Note that "power density" in the present specification etc. is a value obtained by dividing a sputtering power by a target area. Further, scandium and aluminum are sputtered at the same time in a method for manufacturing a piezoelectric thin film according to the present invention, so that there are two kinds of target power densities, i.e., a target power density of scandium and a target power density of aluminum. When "target power density" is merely described in the present specification etc., it represents the target power density of scandium, unless otherwise noted.

In a case where the target power density falls within the range from 0.05 W/cm$^2$ to 10 W/cm$^2$, the scandium content rate falls within the range from 0.5% by atom to 50% by atom.

In order to set the scandium content rate within the range from 35% by atom to 40% by atom, the target power density needs to fall within the range from 6.5 W/cm$^2$ to 8.5 W/cm$^2$.

Note that other conditions are not particularly limited as long as, during the sputtering step, the substrate temperature is in the range from the room temperature to 450° C. and the target power density is in the aforementioned range. For example, a sputtering pressure and a sputtering time period can be appropriately set in accordance with the piezoelectric thin film to be formed.

(Advantage in Piezoelectric Thin Film Formed by a Method for Manufacturing Piezoelectric Thin Film According to the Present Invention)

As described above, the substrate temperature during the sputtering step of the piezoelectric thin film including the Sc-containing aluminum nitride thin film falls within the range from the room temperature to 450° C. This makes it possible to prevent reduction in piezoelectric response generated when the scandium content rate is in the range from 35% by atom to 40% by atom, and in addition, to improve the piezoelectric response when the scandium content rate falls within the range from 35% by atom to 40% by atom in comparison with the piezoelectric response when the aluminum nitride thin film does not contain Sc.

With this, it is unnecessary to set the Sc content rate minutely when the piezoelectric thin film including the Sc-containing aluminum nitride thin film is manufactured, so that the piezoelectric thin film including the Sc-containing aluminum nitride thin film having improved piezoelectric response can be manufactured more easily.

Further, it is unnecessary to set the scandium content rate minutely in a case where the piezoelectric thin film including the Sc-containing aluminum nitride thin film is manufactured industrially. This makes it possible to reduce cost for manufacturing the piezoelectric thin film. Furthermore, it is possible to reduce defective rate of the piezoelectric thin films to be manufactured, and therefore manufacturing quality of the piezoelectric thin films can be improved.

Further, in the method for manufacturing a piezoelectric thin film according to the present invention, it is further preferable that the substrate temperature during the sputtering step falls within the range from 200° C. to 400° C.

In the conventional piezoelectric thin film including the scandium-containing aluminum nitride thin film, reduction in piezoelectric response has been generated when the scandium content rate falls within the range from 35% by atom to 40% by atom. However, in the aforementioned arrangement, reduction in piezoelectric response can be prevented when the scandium content rate falls within the range from 35% by atom to 40% by atom.

This makes it possible to further reduce defective rate of the piezoelectric thin films to be manufactured, and therefore manufacturing quality of the piezoelectric thin films can be improved.

In the method for manufacturing a piezoelectric thin film according to the present invention, furthermore, the substrate temperature during the sputtering step is preferably 400° C.

The aforementioned arrangement can further increase a maximum value of the piezoelectric response of the piezoelectric thin film including the scandium-containing aluminum nitride thin film.

Furthermore, it is preferable that, in the method for manufacturing a piezoelectric thin film according to the present invention, the sputtering during the sputtering step is performed so that the scandium content rate falls within the range from 35% by atom to 40% by atom.

Note that a piezoelectric thin film formed by the method for manufacturing a piezoelectric thin film according to the present invention is in the scope of the present invention.

Further, it is preferable that a full width at half maximum of an X-ray rocking curve of the piezoelectric thin film thus formed is 3.2 degree or less.

Further, it is preferable that the formed piezoelectric thin film has a surface having arithmetic average roughness of 1.2 nm or less.

EXAMPLE

Example 1

Method for Forming Aluminum Nitride Thin Film Added with Scandium

Aluminum and scandium were sputtered to a silicon substrate under an atmosphere of nitrogen. In this way, an Sc-containing aluminum nitride thin film was formed on the silicon substrate.

The sputtering was carried out by using a dual RF magnetron reactivity sputter system (produced by ULVAC Inc., MPS series) with following sputtering conditions: the substrate temperature was 400° C.; a nitrogen gas concentration was 40%; and a grain growth pressure was 0.25 Pa. In the sputtering, aluminum and scandium were sputtered to a target having a diameter of 50.8 mm. Each sputtering of aluminum and scandium was carried out by using a target power of 160 W.

Further, as to a sputtering chamber used, a pressure inside thereof was reduced to $1.2 \times 10^{-6}$ Pa or less, and an argon gas of 99.999% and a nitrogen gas of 99.999% were introduced to the sputtering chamber. Note that the target was subjected to sputtering for three minutes before deposition under the same condition as deposition condition.

Note that the scandium content rate of the Sc-containing aluminum nitride thin film thus formed was calculated on the basis of a result analyzed by an energy dispersive X-ray fluorescence analysis apparatus (produced by Honda, EX-320X).

(How to Measure Piezoelectric Response)

The piezoelectric response of the Sc-containing aluminum nitride thin film thus formed was measured with use of Piezometer (produced by Piezoptest limited PM100) with weighting of 0.25N and frequency of 110 Hz.

(Crystal Structure Analysis Using X-Ray)

A structure and orientation of a crystal of the Sc-containing aluminum nitride of the Sc-containing aluminum nitride thin film thus formed were measured with use of a fully automatic X-ray diffractometer (produced by MAC Science Co. Ltd, M03X-HF) in which CuKα radiation is used as an X-ray source.

A length of the crystal lattice along the c-axis was calculated on the basis of the X-ray diffraction pattern thus measured. The full width at half maximum (FWHM) of the X-ray rocking curve was also measured.

Comparative Example 1

An Sc-containing aluminum nitride thin film was formed under same conditions as those of Example 1, except for the following one difference: a temperature of a silicon substrate was 580° C. during sputtering.

Further, the piezoelectric response of the Sc-containing aluminum nitride thin film formed in the same way as Example 1 was measured. Furthermore, a length of a crystal lattice along a c-axis and a full width at half maximum (FWHM) of an X-ray rocking curve were also measured in the same way as Example 1.

Measured Results of Example 1 and Comparative Example 1

FIG. 1(a) shows the piezoelectric response measured in Example 1, and FIG. 1(b) shows the piezoelectric response measured in Comparative Example 1.

The piezoelectric response has been conventionally reduced when the substrate temperature has been 580° C. However, as shown in FIG. 1(a), reduction in piezoelectric response when Sc content rate falls within the range from 35% by atom to 40% by atom can be prevented by setting the substrate temperature of 400° C. during the sputtering step.

Further, FIG. 1(a) shows that the Sc-containing aluminum nitride thin film formed in a state of the substrate temperature of 400° C. can prevent reduction in piezoelectric response in a case of the Sc content rate within the range from 35% by atom to 40% by atom, and in addition, the piezoelectric response was improved in comparison with that of an aluminum nitride thin film which does not contain scandium.

Next, FIGS. 3(a) and 3(b) each show a parameter calculated on the basis of respective X-ray diffraction patterns of the Sc-containing aluminum nitride thin film formed in Example 1 and that formed in Comparative Example 1. FIG. 3(a) shows a length of a crystal lattice of the formed Sc-containing aluminum nitride along a c-axis, and FIG. 3(b) shows FWHM (the full width at half maximum) of the X-ray rocking curve of the Sc-containing aluminum nitride thus formed.

As shown in FIG. 3(a), a value of the lattice constant c was rapidly reduced when the Sc content rate exceeded 30% by atom both in Example 1 (substrate temperature: 400° C.) and Comparative Example 1 (substrate temperature: 580° C.). However, increase and decrease in lattice constant c obtained when the Sc content rate was increased was not substantially different between Example 1 and Comparative Example 1.

As shown in FIG. 3(b), however, the FWHM of the X-ray rocking curve of Example 1 was largely different from that of Comparative Example 1. In Example 1 (substrate temperature: 400° C.), the FWHM was gradually reduced as the Sc content rate was increased, and when the Sc content exceeded 43% by atom, a value of the FWHM was rapidly increased. Meanwhile, in Comparative Example 1 (substrate temperature: 580° C.), a value of the FWHM was rapidly increased when the Sc content rate exceeded 30% by atom, and was rapidly reduced when the Sc content rate exceeded 35% by atom. Further, similarly in Example 1, the value of the FWHM was rapidly increased again when the Sc content rate exceeded 43% by atom.

Note that the FWHM of the X-ray rocking curve was measured with use of fully automatic X-ray diffractometer (MXP3VA-B type) produced by MAC Science Co. Ltd. In this X-ray diffractometer, Cu-Kα radiation was used as the X-ray source and D:1°, S:1°, and R:0.3° were used as slits.

Example 2

Surface roughness of an Sc-containing aluminum nitride thin film obtained when a substrate temperature during sputtering was 400° C. was measured in a case where a scandium content of 0% by atom, 36% by atom, and 43% by atom, respectively. Further, a particle size (particle diameter) of an Sc-containing aluminum nitride was also measured.

The surface roughness was measured with use of an atomic force microscope (AFM). Note that "surface roughness" in the present specification etc. means arithmetic average roughness (Ra).

Note that the surface roughness was measured with use of SPI3800N produced by Seiko Instrument Inc., and SN-AF-01 produced by Olympus Corporation (length: 100 micron, frequency: 34 kHz, spring constant: 0.08 N/m) was used as a cantilever.

Comparative Example 2

Surface roughness and a particle diameter of an Sc-containing aluminum nitride thin film under same conditions as those of Example 2, except for the following one difference: a temperature of a silicon substrate was 580° C. during sputtering.

Measured Results of Example 2 and Comparative Example 2

Figure 4:
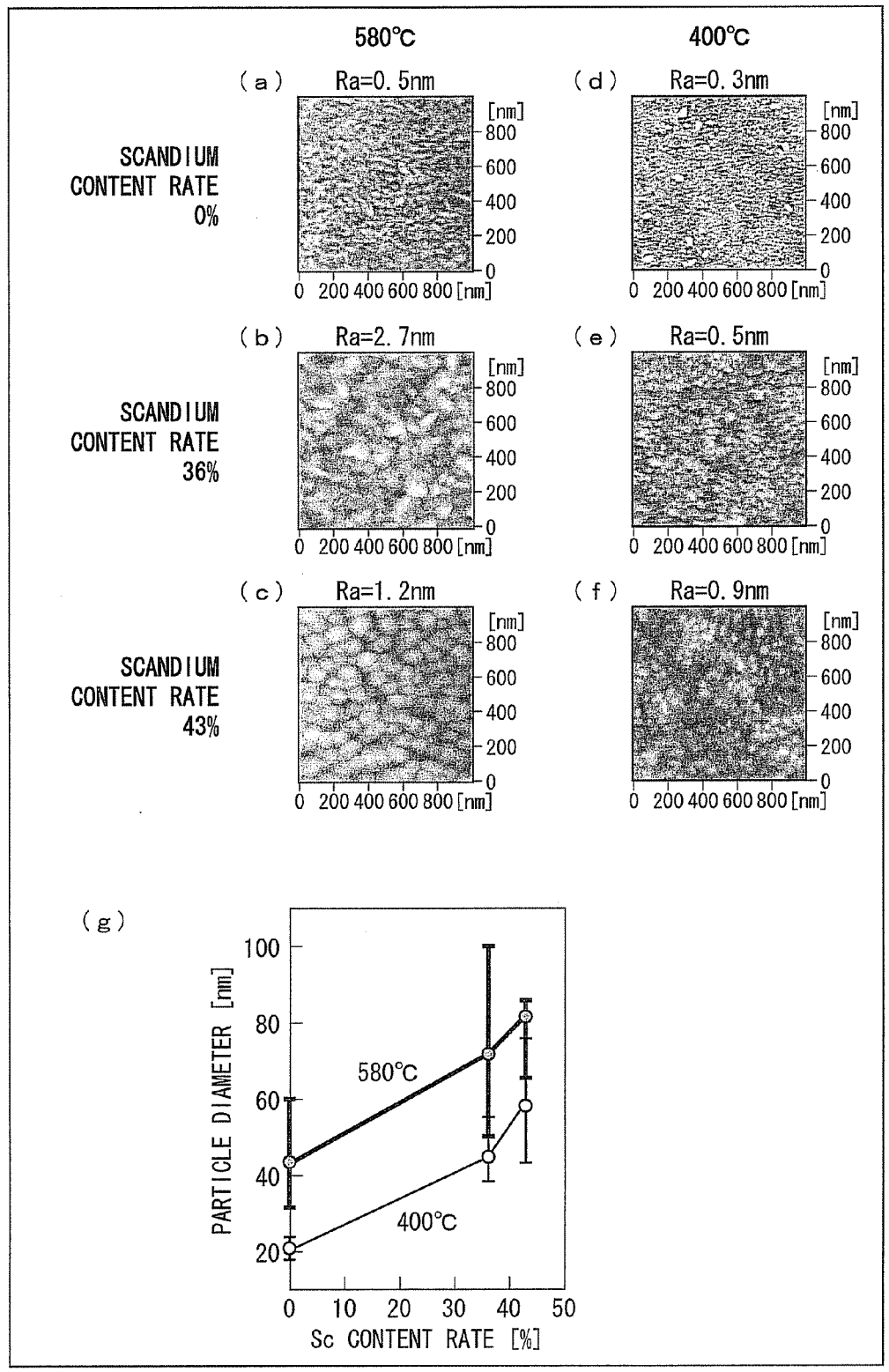
FIG. 4 shows a state in which surface roughness and a particle size of a crystal in Example 2 and those in Comparative Example 2 are measured with use of an atomic force microscope.

FIGS. 4(a) to 4(g) show measured results of the surface roughness measured in Example 2 and Comparative Example 2. FIGS. 4(a) to 4(g) show a state in which surface roughness and a particle diameter of a crystal in Example 2 and those in Comparative Example 2 were measured with use of an atomic force microscope: FIG. 4(a) shows a case where the substrate temperature was 580° C. and the Sc content was 0% by atom, FIG. 4(b) shows a case where the substrate temperature was 580° C. and the Sc content was 36% by atom, FIG. 4(c) shows a case where the substrate temperature was 580° C. and the Sc content was 43% by atom, FIG. 4(d) shows a case where the substrate temperature was 400° C. and the Sc content was 0% by atom, FIG. 4(e) shows a case where the substrate temperature was 400° C. and the Sc content was 36% by atom, and FIG. 4(f) shows a case where the substrate temperature was 400° C. and the Sc content was 43% by atom. Further, FIG. 4(g) shows a relationship between the Sc content rate and the particle diameter of the Sc-containing aluminum nitride when the substrate temperature during the sputtering was 400° C. or 580° C.

FIG. 4(g) shows that the particle diameter becomes larger as the substrate temperature becomes higher. Further, FIG. 4(g) also shows that, irrespective of the substrate temperature, the particle diameter becomes large as the scandium content rate is increased.

Further, when the scandium content rate is 0% by atom as shown in FIGS. 4(a) and 4(d) or 43% by atom as shown in FIGS. 4(c) and 4(f), there was substantially no difference in surface roughness between the case of the substrate temperature of 400° C. and that of 580° C. However, when the scandium content rate was 36% by atom as shown in FIG. 4(b) and FIG. 4(e), the surface roughness was 0.5 nm when the substrate temperature was 400° C., and the surface roughness was 2.7 nm when the substrate temperature was 580° C. Further, as shown in FIG. 4(g), the particle size of the Sc-containing aluminum nitride became uneven when the substrate temperature was 580° C. and the scandium content rate was 36% by atom.

As shown in FIGS. 4(a) to 4(g), this unevenness causes reduction in piezoelectric response of the Sc-containing aluminum nitride thin film having the scandium content rate within the range from 35% by atom to 40% by atom when the substrate temperature was 580° C.

Example 3

Piezoelectric response of an Sc-containing aluminum nitride thin film having an Sc content rate of 37% by atom was measured in a case where a substrate temperature during sputtering was the room temperature (20° C.), 200° C., 400° C., 450° C., 500° C., and 580° C., respectively. Note that (i) conditions of manufacturing of the Sc-containing aluminum nitride thin film other than the substrate temperature and (ii) measurement conditions of the piezoelectric response are similar to Example 1.

FIG. 5 shows the piezoelectric response in a case where the substrate temperature was the room temperature (20° C.), 200° C., 400°, 450° C., 500° C., and 580° C.

As shown in FIG. 5, the piezoelectric response was increased as the substrate temperature is increased between the room temperature to 400° C., and became maximum at the substrate temperature of 400° C. When the substrate temperature exceeded 400° C., the piezoelectric response was rapidly reduced. The piezoelectric response at the substrate temperature of 500° C. became less than the piezoelectric response of the aluminum nitride thin film having the Sc content rate of 0% by atom. A result of FIG. 5 shows that a phenomenon in which the piezoelectric response is reduced when the Sc content of 35% by atom to 40% by atom in comparison with a case of Sc content of 0% by atom can be prevented by setting the substrate temperature during the sputtering within the range from the room temperature (20° C.) to 450° C.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A piezoelectric thin film manufactured by a method for manufacturing a piezoelectric thin film according to the present invention is suitably applied to a device (e.g., RF-MEMS device) in which a piezoelectric phenomenon is utilized. Further, the RF-MEMS device including the piezoelectric thin film manufactured by the method for manufacturing a piezoelectric thin film according to the present invention is suitably used to an electronic device such as a cellular phone which is small and has a high-function.

The invention claimed is:

1. A method for manufacturing a piezoelectric thin film including a substrate on which an aluminum nitride thin film containing scandium is provided, the method comprising:
   an aluminum nitride sputtering step for sputtering aluminum and scandium so as to form, directly on the substrate, the aluminum nitride thin film containing scandium, under an atmosphere containing at least a nitrogen gas, a scandium content rate falls within the range from more than 35% by atom to less than 40% by atom when the number of atoms of scandium and the number of atoms of aluminum of the aluminum nitride thin film are 100% by atom in total,
   the substrate having a temperature within the range from 200° C. to 400° C. during the sputtering step, and
   wherein the substrate consists of a silicon monocrystal or a silicon monocrystal having a polycrystalline film thereon.

2. The method for manufacturing a piezoelectric thin film including a substrate on which an aluminum nitride thin film containing scandium is provided according to claim 1, wherein the temperature of the substrate during the sputtering step is 400° C.

3. The method for manufacturing a piezoelectric thin film including a substrate on which an aluminum nitride thin film containing scandium is provided according to claim 1, wherein the polycrystalline film comprises silicon or diamond.

* * * * *